(12) United States Patent
Moriyama

(10) Patent No.: US 7,794,785 B2
(45) Date of Patent: Sep. 14, 2010

(54) CLEANING METHOD, STORAGE METHOD, PATTERN FORMATION METHOD, DEVICE MANUFACTURING METHOD, ELECTRO-OPTICAL DEVICE, AND ELECTRONIC APPARATUS

(75) Inventor: Hidekazu Moriyama, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 1301 days.

(21) Appl. No.: 10/827,426

(22) Filed: Apr. 20, 2004

(65) Prior Publication Data

US 2004/0244821 A1    Dec. 9, 2004

(30) Foreign Application Priority Data

Apr. 22, 2003   (JP)   ............... 2003-117164

(51) Int. Cl.
*B05D 7/22*    (2006.01)
*B05D 1/36*    (2006.01)
*B08B 9/00*    (2006.01)

(52) U.S. Cl. .................. 427/230; 134/22.1; 134/22.11; 134/22.14

(58) Field of Classification Search ................ 427/230, 427/235; 134/21, 22.1–22.12, 22.14
See application file for complete search history.

(56) References Cited

U.S. PATENT DOCUMENTS

| | | | |
|---|---|---|---|
| 4,388,115 A * | 6/1983 | Sugiyama et al. | ........... 524/105 |
| 5,589,861 A * | 12/1996 | Shibata | ......................... 347/22 |
| 6,446,642 B1 * | 9/2002 | Caren et al. | .............. 134/22.18 |
| 6,559,582 B2 | 5/2003 | Miyamoto et al. | |
| 6,604,809 B2 * | 8/2003 | Katsuragi et al. | ............. 347/28 |
| 6,624,071 B2 | 9/2003 | Seki | |
| 6,830,855 B2 | 12/2004 | Kiguchi et al. | |

FOREIGN PATENT DOCUMENTS

| | | |
|---|---|---|
| CN | 1393704 A | 1/2003 |
| JP | A-62-002593 | 1/1987 |
| JP | A-01-148557 | 6/1989 |
| JP | A-07-148472 | 6/1995 |
| JP | A 9-39260 | 2/1997 |
| JP | A-10-286977 | 10/1998 |
| JP | A 10-337882 | 12/1998 |
| JP | A-11-204529 | 7/1999 |
| JP | A 11-274671 | 10/1999 |
| JP | A 2000-216330 | 8/2000 |
| JP | 2001-088326 A * | 4/2001 |
| JP | A-2001-219579 | 8/2001 |
| JP | A-2001-284798 | 10/2001 |

* cited by examiner

*Primary Examiner*—William Phillip Fletcher, III
(74) *Attorney, Agent, or Firm*—Oliff & Berridge, PLC

(57) ABSTRACT

To provide a pattern formation method capable of forming a pattern by cleaning a liquid droplet ejection head without causing problems during the liquid droplet ejection operation, when the liquid droplet ejection head stored with a storage solution is used again, a pattern formation method includes: filling a passage including a liquid droplet ejection head and a conduit to feed a functional solution to the liquid droplet ejection head with purified water; filling the passage with a solvent dissolving both the purified water and a solvent contained in the functional solution, filling the passage with the solvent contained in the functional solution, surface treating a substrate by forming a lyophobic film on a region surrounding a pattern formation region defined on the substrate; and disposing liquid droplets on the pattern formation region with the liquid droplet ejection head.

9 Claims, 11 Drawing Sheets

CLEANING METHOD, STORAGE METHOD, PATTERN FORMATION METHOD, DEVICE MANUFACTURING METHOD, ELECTRO-OPTICAL DEVICE, AND ELECTRONIC APPARATUS

BACKGROUND OF THE INVENTION

1. Field of Invention

The present invention relates to a method of cleaning a passage for a functional solution including a liquid droplet ejection head, a storage method, a pattern formation method of forming a film pattern by disposing liquid droplets of the functional solution on a substrate, a device manufacturing method, an electro-optical device, and an electronic apparatus.

2. Description of Related Art

In the related art, photolithography has been widely used as a method of manufacturing a device having fine wiring patterns (film patterns), such as a semiconductor integrated circuit. Recently, a device manufacturing method using a liquid droplet ejection method has attracted attention (see Japanese Unexamined Patent Application Publication No. 11-274671 and Japanese Unexamined Patent Application Publication No. 2000-216330).

The liquid droplet ejection method has advantages in that waste of a functional solution is low and the amount and arrangement location of the functional solution disposed on the substrate is capable of being easily controlled. In the liquid droplet ejection method, a liquid droplet ejection head may be periodically cleaned in order to obtain a superior ejection condition. Therefore, various cleaning methods have been proposed (see Japanese Unexamined Patent Application Publication No. 9-39260 and Japanese Unexamined Patent Application Publication No. 10-337882).

SUMMARY OF THE INVENTION

However, when a liquid droplet ejection apparatus used to manufacture a device is stored for a predetermined time, its liquid droplet ejection head is often filled with a water-soluble storage solution.

The water-soluble storage solution is used in consideration of the problem of evaporation. In addition, the liquid droplet ejection head may not be filled with the storage solution but a functional solution (ink) used to manufacture the device. However, if the functional solution is easily dried or needs to be kept cold or frozen, it is not suitable for storage. The liquid droplet ejection head must be stored by using a dedicated storage solution. In addition, when the stored liquid droplet ejection head is used or operated again, the water-soluble storage solution is removed and then the head is filled with the functional solution. However, if the functional solution and the storage solution are not easily soluble with each other, extracted solid materials may clog the passage for the functional solution, including the liquid droplet ejection head, so that there are disadvantages in that the liquid droplet ejection operation experiences problems and the functional solution may degenerate.

The present invention is contrived in consideration of the foregoing circumstances. Accordingly, the present invention provides a cleaning method that performs excellent cleaning by smoothly filling the passage with a functional solution without causing problems during the liquid droplet ejection operation and without degenerating the functional solution, when the liquid droplet ejection head stored with a storage solution is used again. The present invention also provides a storage method of filling the passage with the storage solution without the extraction of the solid materials, when the liquid droplet ejecting head is stored after the liquid droplet ejecting operation ends. The present invention also provides a pattern formation method of forming a superior pattern by smoothly filling the passage with a functional solution without causing problems during the liquid droplet ejection operation and without degenerating the functional solution, and a device manufacturing method. The present invention also provides an electro-optical device and an electronic apparatus manufactured by using a functional solution having a desired function and superior liquid droplet ejection operation.

In order to address the problems, an aspect of the present invention provides a method of cleaning a passage including a liquid droplet ejection head and a conduit to feed a functional solution to the liquid droplet ejection head. The method includes: a first replacement step of filling the passage with purified water; a second replacement step of filling the passage with a solvent dissolving both a solvent contained in the functional solution and the purified water; and a third replacement step of filling the passage with the solvent contained in the functional solution. In this case, the passage may be filled with the functional solution after the third replacement step.

According to an aspect of the present invention, even in a case where a passage including a liquid droplet ejection head is stored by using a water-soluble storage solution, the passage is first filled with purified water. It is next filled with a predetermined solvent dissolving both the purified water and a solvent contained in a functional solution. Finally, it is filled with the solvent contained in the functional solution. Therefore, it is possible to reduce or prevent problems, such as extraction of solid materials and degeneration of the functional solution, and to clean the passage and smoothly fill the passage with the functional solution.

An aspect of the present invention provides a method of cleaning a passage including a liquid droplet ejection head filled with a predetermined storage solution and a conduit to feed a functional solution to the liquid droplet ejection head. The method includes: a first replacement step of filling the passage with a first solution dissolving the storage solution; a second replacement step of filling the passage with a second solvent dissolving both the first solvent and a solvent contained in the functional solution; and a third replacement step of filling the passage with the solvent contained in the functional solution. In this case, the passage may be filled with the functional solution after the third replacement step.

According to an aspect of the present invention, even in a case where a passage including a liquid droplet ejection head is stored by using a predetermined storage solution rather than a water-soluble storage solution, the passage is first filled with a first solvent dissolving the storage solution. It is next filled with a second solvent dissolving both the first solvent and a solvent contained in a functional solution. Finally, it is filled with the solvent contained in the functional solution. Therefore, it is possible to reduce or prevent problems, such as extraction of solid materials and degeneration of the functional solution, and to clean the passage and smoothly fill the passage with the functional solution.

An aspect of the present invention provides a method of storing a passage including a liquid droplet ejection head and a conduit to feed a functional solution to the liquid droplet ejection head. The method includes: a first step of filling the passage including the liquid droplet ejection head having ejected the functional solution with a solvent contained in the functional solution; a second replacement step of filling the passage with a solvent dissolving both the solvent contained in the functional solution and the purified water; and a third process of filling the passage with purified water. After the third step, the passage is filled with a water-soluble storage solution.

According to an aspect of the present invention, when the liquid droplet ejection head having ejected the liquid droplets of the functional solution is stored, the passage is first filled with a solvent contained in the functional solution. Second, the passage is filled with the predetermined solvent dissolving both the solvent contained in the functional solution and the purified water. Finally, the passage is filled with the purified water; so that it is possible to reduce or prevent problems, such as extraction of solid materials and to clean the passage and store the passage with the water-soluble solution.

An aspect of the present invention provides a storage method having a step of filling a passage including a liquid droplet ejection head and a conduit to feed a functional solution to the liquid droplet ejection head with a predetermined storage solution. The method includes: a first step of filling the passage including the liquid droplet ejection head having ejected the functional solution with a solvent contained in the functional solution; a second replacement step of filling the passage with a first solvent dissolving both the solvent contained in the functional solution and the storage solution; and a third step of filling the passage with a second solvent dissolving the storage solution. After the third step, the passage is filled with the storage solution.

According to an aspect of the present invention, when the passage including the liquid droplet ejection head is stored with the predetermined storage solution other than a water-soluble storage solution, the passage is first filled with the solvent contained in the functional solution. Second, the passage is filled with the first solvent dissolving both the solvent contained in the functional solution and the storage solution. Finally, the passage is filled with the second solvent dissolving the storage solution, so that it is possible to reduce or prevent problems, such as extraction of solid materials and to clean the passage and store the passage with the storage solution.

An aspect of the present invention provides a pattern formation method of forming a film pattern by disposing liquid droplets of a functional solution on a substrate. The method includes: a first replacement step of filling a passage, including a liquid droplet ejection head to dispose the liquid droplets and a conduit to feed the functional solution to the liquid droplet ejection head, with purified water; a second replacement step of filling the passage with a solvent dissolving both a solvent contained in the functional solution and the purified water; a third replacement step of filling the passage with the solvent contained in the functional solution; a surface treatment step of forming a lyophobic film on a region surrounding a pattern formation region of forming the film pattern defined on the substrate; and a material disposing step of disposing the liquid droplets on the pattern formation region with the liquid droplet ejection head.

According to an aspect of the present invention, even in a case where a passage including a liquid droplet ejection head is stored by using a water-soluble storage solution, the passage is first filled with purified water. It is next filled with a predetermined solvent dissolving both the purified water and a solvent contained in a functional solution. Finally, it is filled with the solvent contained in the functional solution. Therefore, it is possible to reduce or prevent problems, such as extraction of solid materials and degeneration of the functional solution, and to clean the passage and smoothly fill the passage with the functional solution. Since the lyophobic film is provided in order to surround the pattern formation region forming a film pattern, the ejected liquid droplets are smoothly disposed on the pattern formation region.

An aspect of the present invention provides a pattern formation method of forming a film pattern by disposing liquid droplets of a functional solution on a substrate. The method includes: a first replacement step of filling a passage including a liquid droplet ejection head filled with a predetermined storage solution and a conduit to feed the functional solution to the liquid droplet ejection head with a first solvent dissolving the storage solution; a second replacement step of filling the passage with a second solvent dissolving both the first solvent and a solvent contained in the functional solution; a third replacement step of filling the passage with the solvent contained in the functional solution; a surface treatment step of forming a lyophobic film on a region surrounding a pattern formation region of forming the film pattern defined on the substrate; and a material disposing step of disposing the liquid droplets on the pattern formation region with the liquid droplet ejection head.

According to an aspect of the present invention, even in a case where a passage including a liquid droplet ejection head is stored by using a predetermined storage solution rather than a water-soluble storage solution, the passage is first filled with a first solvent dissolving the storage solution. It is next filled with a second solvent dissolving both the first solvent and a solvent contained in a functional solution. Finally, it is filled with the solvent contained in the functional solution. Therefore, it is possible to reduce or prevent problems, such as extraction of solid materials and degeneration of the functional solution, and to clean the passage and smoothly fill the passage with the functional solution. Since the lyophobic film is provided in order to surround the pattern formation region forming a film pattern, the ejected liquid droplets are smoothly disposed on the pattern formation region.

In the pattern formation method of an aspect of the present invention, the lyophobic film may be a monolayer formed on a surface of the substrate. The monolayer may be a self-assembled film made of organic molecules. As a result, it is possible to easily form the lyophobic film. An example of the self-assembled film includes a self-assembled film made of fluoroalkyl silane.

The lyophobic film may be a fluoride polymer film. The fluoride polymer film can be easily formed with a plasma treatment using, for example, fluorocarbon compound as a reaction gas.

In the pattern formation method according to an aspect of the present invention, the functional solution may exhibit electrical conductivity by thermal or optical treatments. According to an aspect of the present invention, it is possible to form a thin film pattern as a wiring pattern and to apply the method to various devices.

In addition, by using a material to form a light-emitting element, such as organic EL or RGB ink materials as well as an organic silver compound or conductive particles, it is possible to apply the method to the organic EL device or a liquid crystal display device having color filters.

In a device manufacturing method including forming a film pattern on a substrate, the film pattern may be formed on the substrate by the aforementioned pattern formation methods.

According to an aspect of the present invention, it is possible to manufacture a device having a film pattern formed in a desired pattern shape by using a functional solution having a desired function without degeneration under a superior liquid droplet ejection operation.

An aspect of the present invention provides an electro-optical device including a device manufactured by using the aforementioned device manufacturing method. The present invention provides an electronic apparatus including the aforementioned electro-optical device. According to an aspect of the present invention, since a film pattern having a superior conductivity formed under a superior liquid droplet ejection operation by using a functional solution having a desired function is implemented, it is possible to provide an electro-optical device and an electronic apparatus having superior performance.

Here, examples of the electro-optical device include a plasma display device, a liquid crystal display device, and an organic electroluminescent display device.

Examples of an ejection method used for the liquid droplet ejection apparatus (inkjet apparatus) include a charging control method, a pressing vibration method, an electro-mechanical conversion method, an electro-thermal conversion method, an electrostatic suction method, and so on. In the charging control method, materials (a functional solution) are ejected from an ejection nozzle by providing charges to the materials with charging electrodes and controlling a flying direction of the materials with deflecting electrodes.

In the pressing vibration method, the materials are ejected into a front end of the ejection nozzle by applying an ultra-high pressure of about 30 kg/cm$^2$ to the materials. When a control voltage is not applied, the materials go straight to be ejected from the ejection nozzle. However, when the control voltage is applied, the materials are spraying due to electrostatic repulsion between the materials, so that the materials cannot be ejected from the ejection nozzle. In the electromechanical conversion method using a property of a piezoelectric element that is deformed with applied electrical pulse signal, a pressure is applied to a space containing the materials through a flexible material by the deformation of the piezoelectric element, so that the materials can be pushed out from the space, thereby being ejected from the ejection nozzle. In the electro-thermal conversion method, the materials are rapidly vaporized by a heater provided to a space containing the materials to generate bubbles, so that the materials contained in the space can be ejected by the pressure of the bubbles.

In the electrostatic suction method, a small weak pressure is applied to a space containing the materials to generate a meniscus of the materials at an ejection nozzle. When an electro-static attraction is applied, the materials are ejected. A method using a change of viscosity of fluid due to electric field or a method of emitting discharge sparks may be utilized. The liquid droplet ejection method has advantages in that waste of used materials is small and a desired amount of the materials is capable of being disposed at a desired location. The weight of a droplet of the functional solution (a liquid material) ejected by the liquid droplet ejection method is in a range of, for example, 1 to 300 nanograms.

A liquid material containing a functional solution means a medium having a viscosity such that it can be ejected from an ejection nozzle of a liquid droplet ejection head (an inkjet head). The liquid material may be a water-based or oil-based material. A material having enough fluidity (viscosity) for the material to be ejected from the nozzle is satisfactory. If it is a fluid as a whole, the material having even solid materials mixed thereto is satisfactory.

Materials contained in the liquid material may be materials dissolved by heating above their melting points as well as micro-particles dispersed in a solvent. The materials may be colorants, pigments, and other additive functional materials as well as a solvent. The substrate may include a flat substrate and a curved substrate. Hardness of its pattern formation plane is not necessarily high. The substrate may include a glass, a plastic, a metal, and other flexible material, such as a film, a paper, a rubber, and so on.

DETAILED DESCRIPTION OF EXEMPLARY EMBODIMENTS

Pattern Formation Method

Figure 1:
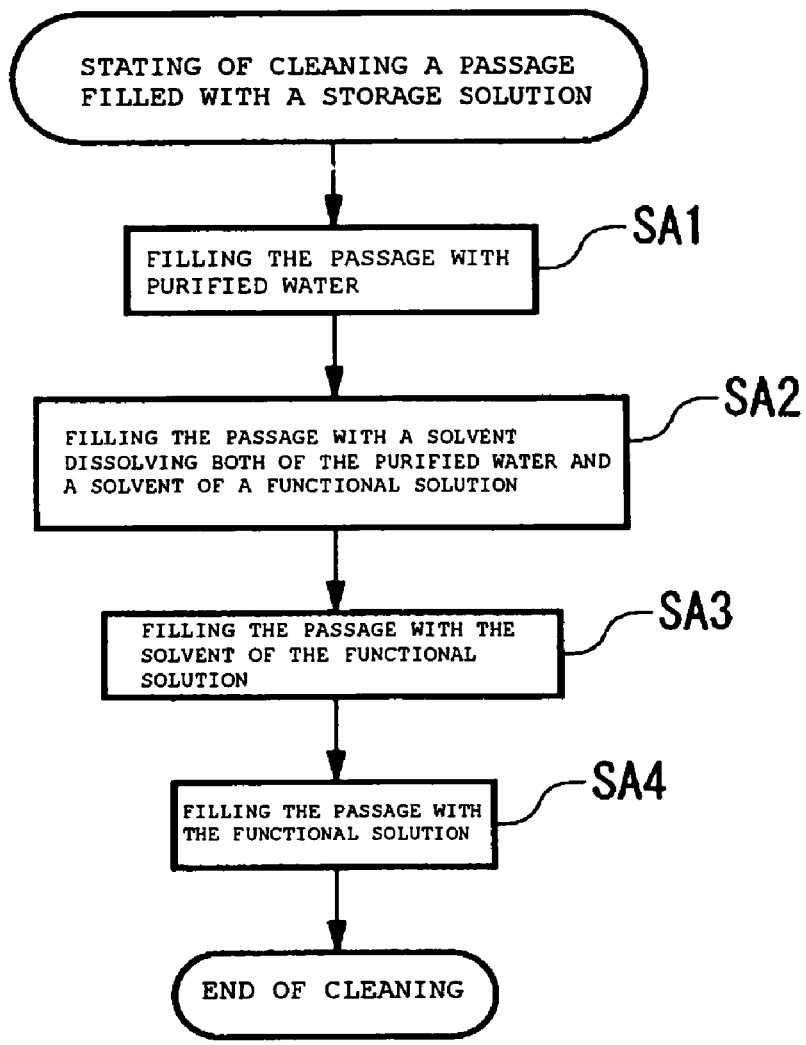
FIG. 1 is a flowchart illustrating an exemplary embodiment of a cleaning process constituting a portion of a device manufacturing method according to an aspect of the present invention.
Figure 2:
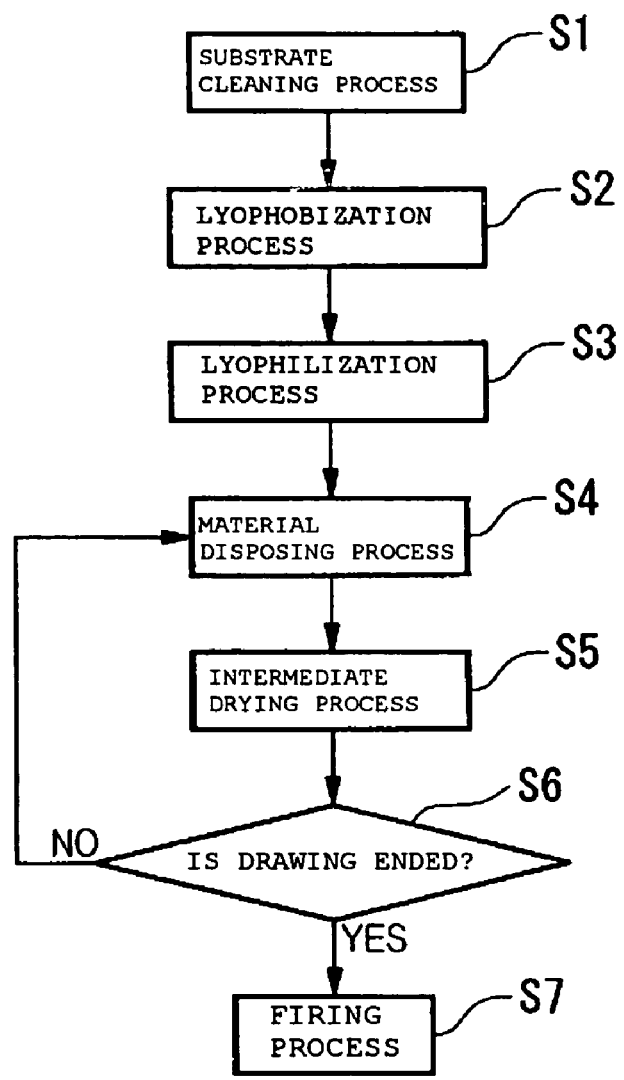
FIG. 2 is a flowchart illustrating an exemplary embodiment of a pattern formation method according to an aspect of the present invention.

Now, a pattern formation method according to an aspect of the present invention will be described with reference to the accompanying drawings. FIGS. 1 and 2 are flowcharts illustrating an exemplary embodiment of a pattern formation method according to the present invention. In the present exemplary embodiment, a case in which a conductive film wiring pattern is formed on a glass substrate is exemplified. A functional solution containing a material exhibiting electrical conductivity by a thermal treatment, and specifically, silver micro-particles dispersed in tetradecane, serving as a dispersing medium, is used as a functional solution to form the conductive film wiring pattern.

The pattern formation method according to the present exemplary embodiment includes a cleaning process to clean a passage including a liquid droplet ejection head stored by using a predetermined storage solution and a conduit to feed a functional solution to the liquid droplet ejection head and filling the passage with the functional solution; and a pattern formation process to form a pattern by using the cleaned liquid droplet ejection head.

In FIG. 1, the cleaning process constituting a portion of the pattern formation method according to an aspect of the present embodiment includes a first replacement process (Step SA1) to fill a passage including a liquid droplet ejection head filled with a water-soluble storage solution and a conduit to feed a functional solution to the liquid droplet ejection head with purified water; a second replacement process (Step SA2) to fill the passage with a solvent dissolving both the purified water and a solvent contained in the functional solution used to manufacture a device; a third replacement process (Step SA3) to fill the passage with the solvent contained in the functional solution; and a fourth replacement process (Step SA4) to fill the passage with the functional solution.

As shown in FIG. 2, the pattern formation process includes: a substrate cleaning process (Step S1) to clean a substrate, where liquid droplets of a functional solution are disposed, by using a predetermined solution, etc.; a lyophobization process (Step S2) constituting a portion of a surface treatment process to provide a lyophobic property to a substrate by forming a lyophobic films on the substrate surface; a lyophilization process (Step S3) constituting a portion of the surface treatment process to provide a lyophilic property to a pattern formation region, where a wiring pattern is formed, on a surface of the substrate treated with the lyophobization process; a material disposing process (Step S4) to form (drawing) the film pattern by disposing the liquid droplets of the functional solution on the pattern formation region of the substrate based on a liquid droplet ejection method; an intermediate drying process (Step S5) including optical and thermal treatments to remove at least a portion of liquid component of the functional solution disposed on the substrate; and a firing process (Step S7) to fire the substrate where a predetermined film pattern is depicted.

After the intermediate drying process, a process (Step S6) to determine whether or not a predetermined pattern drawing ends is performed. If the pattern drawing ends, the firing process proceeds. If the pattern drawing does not end, the material disposing process proceeds.

Figure 3:
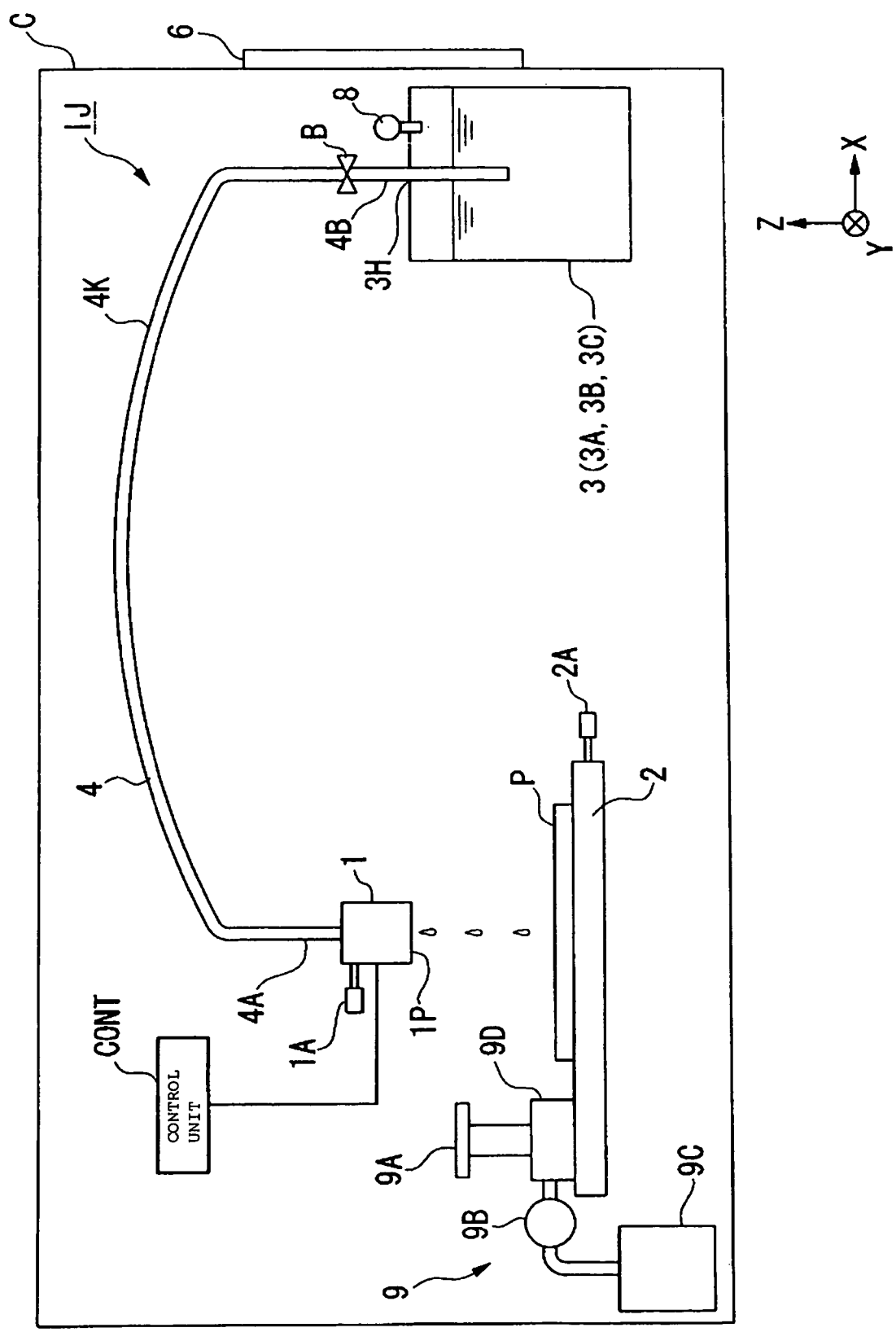
FIG. 3 is a schematic illustrating an exemplary embodiment of a pattern formation device according to an aspect of the present invention.

FIG. 3 is a schematic of the liquid droplet ejection apparatus constituting a portion of a pattern formation apparatus used for the pattern formation method according to an aspect of the present invention.

In FIG. 3, the liquid droplet ejection apparatus IJ includes a liquid droplet ejection head 1 to eject liquid droplets of the functional solution (ink); a stage 2 to support the substrate P where the liquid droplets of the ink ejected from the ejection head 1 is disposed; a tank 3 as a containing unit containing the ink; and a conduit 4K connecting the ejection head 1 and the tank 3 and constituting a portion of a passage 4 through which the ink flows. The passage 4 through which the ink flows includes the conduit 4K and the ejection head 1. An operation of the liquid droplet ejection apparatus IJ, including an ejection operation of the ejection head 1, is controlled by a control unit CONT. All components of the liquid droplet ejection apparatus IJ including the ejection head 1, the conduit 4K, and the tank 3 are accommodated in a chamber C. The temperature in the interior of the chamber C is controlled by a temperature adjustment unit 6. The interior of the chamber C may be set to an atmospheric atmosphere or an inert gas atmosphere of nitrogen gas, etc. The chamber C and the liquid droplet ejection apparatus IJ accommodated in the chamber C are installed within a clean room, so that cleanliness can be maintained in terms of particles or chemicals.

In the following description, a first direction on a horizontal plane is referred to as an X-axis direction. A second direction perpendicular to the first direction on the same horizontal plane is referred to as a Y-axis direction. A third direction perpendicular to the X-axis and Y-axis directions is referred to as a Z-axis direction. In addition, rotational directions about X, Y, and Z axes are referred to as θX, θY, and θZ directions, respectively.

The liquid droplet ejection apparatus IJ forms a film made of materials contained in the ink by disposing liquid droplets of the ink on a surface of the substrate P. Here, the ink used in the present exemplary embodiment may include, for example, silver micro-particles dispersed in tetradecane, serving as a predetermined dispersing medium. The liquid droplet ejection apparatus IJ ejects the ink on the substrate P to form a wiring pattern (a conductive film pattern) of a device. The liquid droplet ejection apparatus L1 may manufacture a color filter by ejecting ink containing a color filter formation material for a liquid crystal display device, or it may manufacture a device, such as an organic EL device.

The ejection head 1 to quantitatively eject (dropping) the liquid droplets of the ink on the substrate P supported by the stage 2 includes a plurality of nozzles, to eject the liquid droplets, which are provided on a nozzle formation plane 1P of the ejection head 1. In addition, a head moving unit 1A to movably support the ejection head 1 is provided to the ejection head 1. The head moving unit 1A moves the ejection head 1 in the X, Y, and Z-axis directions and moves slightly in the θX, θY, and θZ directions. The temperature of the liquid droplets ejected from the ejection head 1 is controlled by a temperature adjustment unit (not shown) provided for the ejection head 1. The temperature adjustment unit also adjusts the viscosity of the liquid droplets as a desired value.

The stage 2 to support the substrate P includes a suction hold unit (not shown) to vacuum-suction the substrate P. A stage moving unit 2A to movably support the stage 2 is provided for the stage 2. The stage moving unit 2A moves the stage 2 in the X, Y, and θZ directions.

The conduit 4K constructed with, for example, a synthetic resin tube is flexible. The passage 4 constructed with the conduit 4K has one end 4A connected to the ejection head 1 and the other end 4B connected to the tank 3. A valve B is provided at the other end 4B of the conduit 4K. The opening and closing operations of the valve B are controlled by the control unit CONT. The control unit CONT controls the flow of the ink through the passage 4 by controlling the valve B. The control unit CONT feeds or blocks the ink from the tank 3 to the ejection head 1 by controlling the valve B. Since the conduit 4K is constructed with a flexible material, the movement of the ejection head 1 by the head moving unit 1A is not interrupted.

For the tank 3 containing the ink, a radical elimination process is performed on the ink within the tank 3 in advance. The tank 3 includes an opening 3H into which the conduit 4K can be inserted. The inserting of the conduit 4K into the opening 3H results in substantially sealing the tank 3. A tank pressure adjustment unit 8 to adjust the pressure of the internal space of the tank 3 is provided for the tank 3. The operation of the tank pressure adjustment unit 8 is controlled by the control unit CONT. The control unit CONT controls the pressure of the interior of the tank 3 through the tank pressure adjustment unit 8. The pressure of the other end 4B of the passage 4 is controlled by adjusting the pressure of the tank 3. In the tank 3, although not shown in the drawings, a temperature adjustment unit to adjust the temperature of the ink within the tank and a stirring unit to stir the ink within the tank are attached to the tank 3. The temperature of the ink within the tank is adjusted by the temperature adjustment unit, so that the viscosity of the ink can be adjusted to a desired value.

A suction unit 9 capable of suctioning the ink in the ejection head 1 is provided at positions on the stage 2 excluding a position where the substrate P is mounted. The suction unit 9 includes a cap portion 9A which is closely connected to the nozzle formation plane 1P, where the nozzle is formed in the ejection head 1, to form a sealed space between the nozzle formation plane 1P and the cap portion; a lifter 9D to lift and supporting the cap portion 9A; a pump 9B to suction the ink in the nozzle of the ejection head 1 by suctioning gas within the sealed space; and an exhausted liquid receiving unit 9C to receive the ink suctioned from the ejection head 1. The position alignment of the nozzle formation plane 1P and the cap portion 9A in the X and Y directions is performed with relative movement of the ejection head 1 and the stage 2 based on the head moving unit 1A and the stage moving unit 2A. The nozzle formation plane 1P of the ejection head 1 and the cap portion 9A of the suction unit 9 are closely contacted to each other by lifting the cap portion 9A to the ejection head 1. A suction operation of the suction unit 9 is controlled by the control unit CONT, and the control unit adjusts the pressure of the sealed space though the suction unit 9. The pressure at the one end 4A of the passage 4 is controlled by adjusting the pressure of the sealed space formed by the nozzle formation plane 1P and the cap portion 9A. The tank pressure adjustment unit 8 and the suction unit 9 constitute a pressure adjustment unit to adjust the pressure of the passage 4.

Next, a method of manufacturing a device by using the aforementioned liquid droplet ejection apparatus IJ will be described. In the exemplary embodiment, the passage 4 including the liquid droplet ejection head 1 to dispose the liquid droplets and the conduit 4K to feed the ink to the liquid droplet ejection head 1 is stored in a state where it is filled with an aqueous polyethylene glycol solution, that is, a water-soluble storage solution. The passage 4 is subjected to a cleaning process before an ejection operation to manufacture a device.

In the cleaning process, the other end 4B of the conduit 4K is connected to the tank 3A containing the purified water (a first solvent). The tank 3A has the same construction as the tank 3 that contains the ink, and includes the tank pressure adjustment unit 8, etc. A radical elimination process is performed on the purified water within the tank 3A in advance. The purified water, that is, the first solvent, is capable of dissolving the aqueous polyethylene glycol solution, that is, the storage solution, and the purified water (the first solvent) and the storage solution are easily soluble to each other. When the tank 3A containing the purified water is connected to the other end 4B of the conduit 4K, the control unit CONT sets a predetermined pressure difference between the one end 4A and the other end 4B of the passage 4 by using the suction unit 9 and the tank pressure adjustment unit 8, as a pressure adjustment unit.

Figure 4:
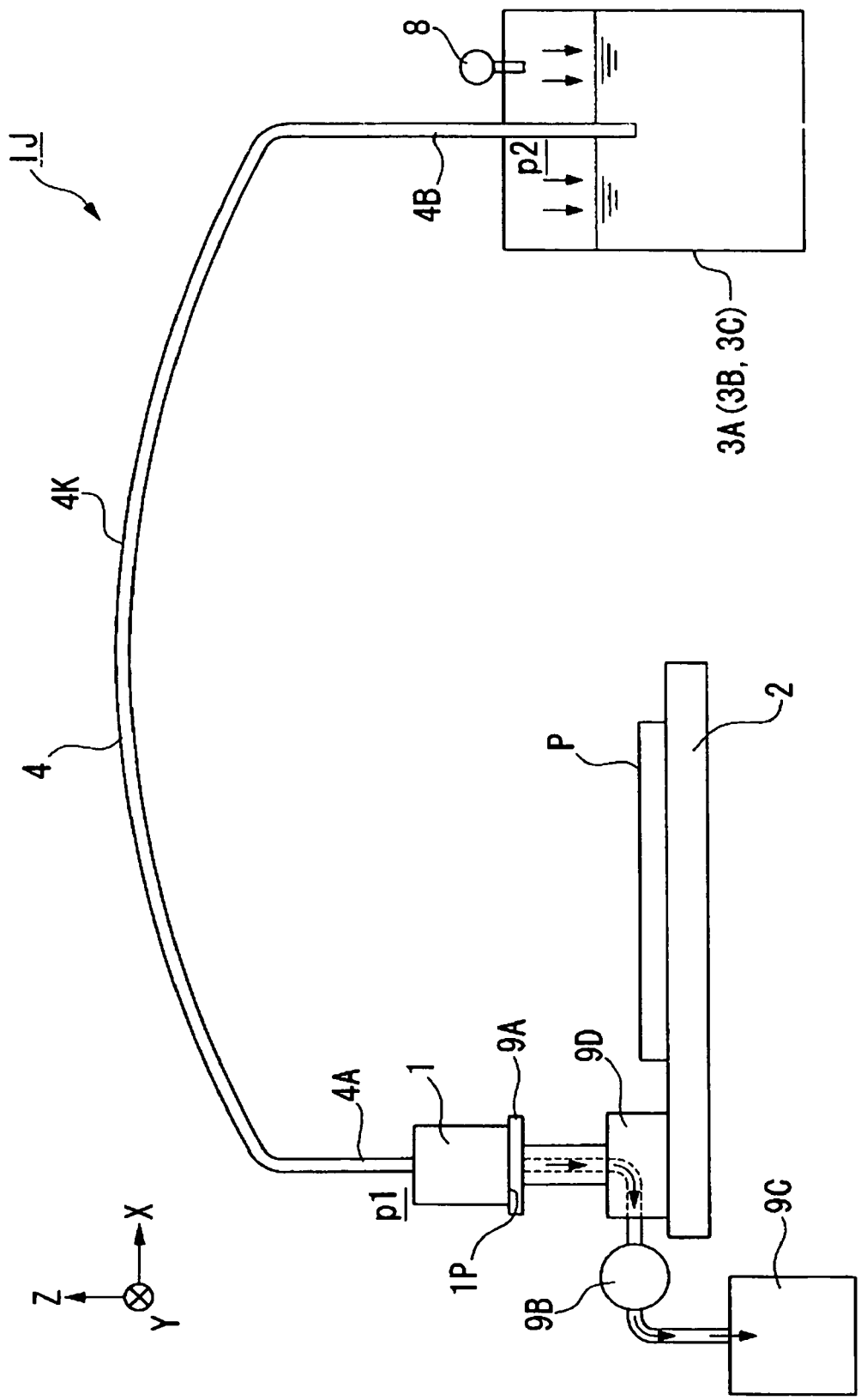
FIG. 4 is a schematic illustrating states of cleaning operations performed by a pattern formation device according to an aspect of the present invention.

FIG. 4 is a schematic illustrating a state in which the pressure adjustment unit 8 performs pressure adjustment of the one end 4A and the other end 4B of the passage 4. As shown in FIG. 4, position alignment of the ejection head 1 and the cap portion 9A of the suction unit 9 in the X and Y axis directions are performed by the movement of the stage 2. The cap portion 9A and the nozzle formation plane 1P of the ejection head 1 are closely contacted to each other by the lifting of the cap portion 9A. Next, the pressure of the sealed space formed between the nozzle formation plane 1P of the ejection head 1 and the cap portion 9A are reduced by the operation of the pump 9B, so that the one end 4A of the passage 4 is set to the pressure p1. The pressure of the tank 3 is applied by the tank pressure adjustment unit 8, so that the other end 4B of the passage 4 is set to the pressure p2. The control unit CONT sets the predetermined pressure difference (p2−p1) between the one end 4A and the other end 4B of the passage 4 by adjusting a suction amount per unit time with the suction unit 9 (the pump 9B) while adjusting the pressure of the tank 3 with the tank pressure adjustment unit 8.

Here, the control unit CONT sets the pressure difference (p2−p1) in the cleaning process to a higher value than the pressure difference in the ejection operation, that is, a later process, to manufacture the device. In this state, the valve B opens, the suction unit 9 suctions the storage solution filling the passage 4 from the nozzle, and the suctioned storage solution is received by the exhausted solution receiving unit 9C. The purified water in the tank 3A fills the passage 4 by performing the pressurizing operation of the tank 3A and the suction operation of the suction unit 9, and then the passage 4 is filled with the purified water. The suctioned purified water (a cleaning solution) is received by the exhausted solution receiving unit 9C. The suction operation is performed for a predetermined time, so that the passage 4 is cleaned by the filling of the sufficient amount of purified water (Step SA1).

Since the one end 4A and the other end 4B of the passage 4 are set to a predetermined pressure difference, the cleaning solution (the purified water) flows through the passage 4 at a higher speed than that of the ejection operation, a later process, to manufacture the device. Therefore, the cleaning process can be sufficiently performed at a high speed.

When the passage 4 is filled with the purified water, the operations of the tank pressure adjustment unit 8 and the suction unit 9 are interrupted. After that, the conduit 4K and the tank 3A are disconnected from each other. The other end 4B of the conduit 4K is connected to the tank 3B containing isopropyl alcohol (a second solvent). The tank 3B also has the same construction as the tanks 3 and 3A. Herein, the second solvent, that is, isopropyl alcohol, is a solvent capable of dissolving both the first solvent, that is, the purified water, and the dispersing medium, that is, tetradecane, contained in the ink. The second solvent is easily soluble in both the purified water and the solvent contained in the ink. A radical elimination process is performed on isopropyl alcohol within the tank 3B in advance. Similar to the process sequence described with reference to FIG. 4, when the tank 3B containing isopropyl alcohol is connected to the other end 4B of the conduit 4K, the control unit CONT sets a predetermined pressure difference between the one end 4A and the other end 4B of the passage 4 by using the suction unit 9 and the tank pressure adjustment unit 8 collectively serving as a pressure adjustment unit. The passage 4 is filled with the second solvent, that is, isopropyl alcohol (Step SA2).

When the passage 4 is filled with the second solvent, the operations of the tank pressure adjustment unit 8 and the suction unit 9 are interrupted. After that, the conduit 4K and the tank 3B are disconnected from each other. The other end 4B of the conduit 4K is connected to the tank 3c containing tetradecane, serving as a dispersing medium contained in the ink. The tank 3C also has the same construction as the tanks 3, 3A, and 3B. Herein, tetradecane is a solvent capable of dissolving the second solvent, that is, isopropyl alcohol, and it is easily soluble in isopropyl alcohol. In addition, tetradecane is a non-polar solvent. A radical elimination process is performed on the tetradecane within the tank 3C in advance. Similar to the process sequence described with reference to FIG. 4, when the tank 3C containing the tetradecane is connected to the other end 4B of the conduit 4K, the control unit CONT sets a predetermined pressure difference between the one end 4A and the other end 4B of the passage 4 by using the suction unit 9 and the tank pressure adjustment unit 8 collectively serving as a pressure adjustment unit. The passage 4 is filled with the dispersing medium contained in the ink, that is, tetradecane (Step SA3).

Although the dispersing medium of the ink of the present exemplary embodiment is tetradecane, in a case where the ink includes plural kinds of solvents, the solvent filled in Step SA3 need not be completely identical to the plural kinds of the solvents contained in the ink, but any solvent among the plural kinds of solvents can be utilized. Here, the utilized arbitrary solvent may be a solvent (a main solvent) having the largest content among the plural kinds of solvent.

When the passage 4 is filled with tetradecane, the operations of the tank pressure adjustment unit 8 and the suction unit 9 are interrupted. After that, the conduit 4K and the tank 3C are disconnected from each other. The other end 4B of the conduit 4K is connected to the tank 3 containing the ink. A radical elimination process is performed on the ink within the tank 3 in advance. Similar to the process sequence described with reference to FIG. 4, when the tank 3 containing the ink is connected to the other end 4B of the conduit 4K, the control unit CONT sets a predetermined pressure difference between the one end 4A and the other end 4B of the passage 4 by using the suction unit 9 and the tank pressure adjustment unit 8 collectively serving as a pressure adjustment unit, and the passage 4 is filled with the ink (Step SA4).

At this time, the passage 4 may be filled with the ink while the temperature of the ink is adjusted by using the temperature adjustment unit 6 to adjust the temperature of the inside of the chamber C and a temperature adjustment unit (not shown) to adjust the temperature of the passage 4. For example, since the viscosity of the ink is reduced due to the heating of the ink, it is possible to smoothly perform the replacement process while reducing or preventing the generation of bubbles. The passage 4 including the conduit 4K may be filled with the ink while ultrasonic waves are applied. As a result, it is possible to exhaust the bubbles existing in the passage 4, such as bubbles attached on the inner wall of the conduit 4K, and bubbles in the ink from the ejection head 1.

When the cleaning process ends, the control unit CONT stops the suction operation of the suction unit 9 and the pressurizing operation of the tank pressure adjustment unit 8 for pressuring the tank 3.

The stage 2 moves to locate the substrate P under the ejection head 1 and starts an ejection operation to manufacture the device. Here, the control unit CONT sets the pressure difference between the one end 4A and the other end 4B of the passage 4 to a lower value than that in the cleaning process.

The temperature adjustment unit 6 also adjusts the temperature of the chamber C to an optimal value to manufacture the device. Next, a liquid droplet ejection operation to manufacture the device is performed.

In the present exemplary embodiment, since a water-soluble polyethylene glycol is used as a storage solution, the first replacement process SA1 is constructed with a cleaning process using the purified water. However, the cleaning process according to an aspect of the present invention may be used for a case where the storage solution is not an aqueous solution. In this case, the solvent dissolving the storage solution may be used as the first solvent used in the first replacement process.

Figure 5:
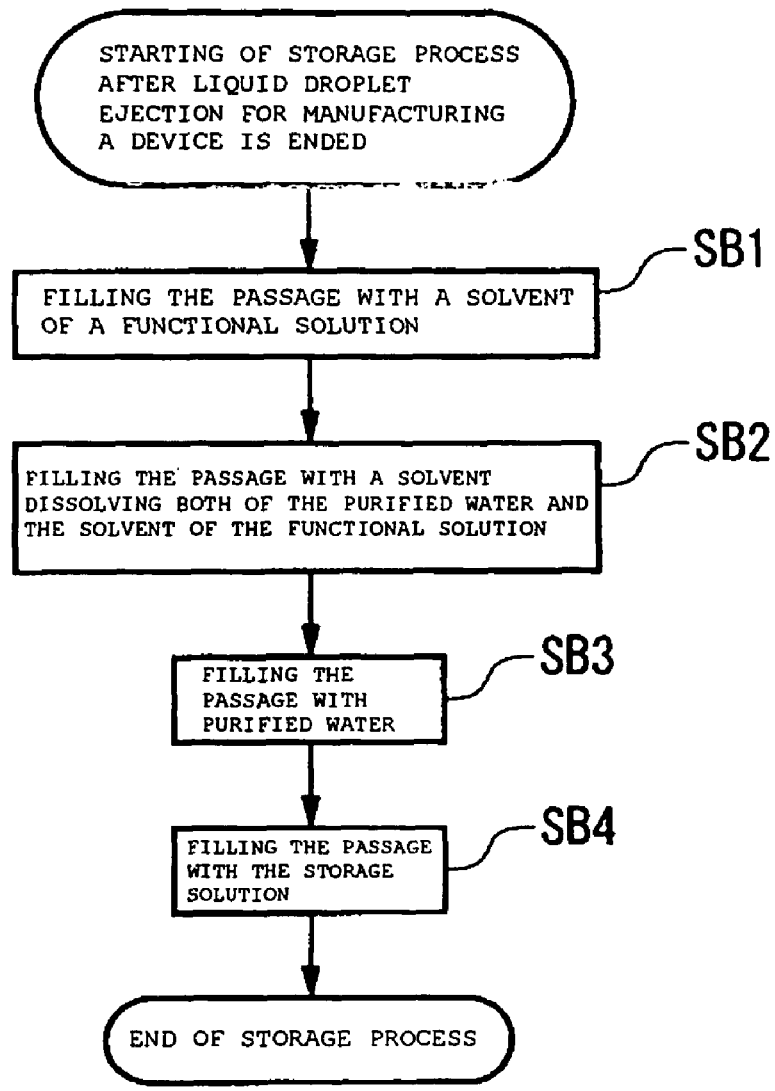
FIG. 5 is a flowchart illustrating an example of a storage process according to an aspect of the present invention.

The cleaning process from the state of storage to the ejection-available state of the liquid droplets of the ink has been described. Now, a process sequence from the completion of the ejection operation of the liquid droplets of the ink to the state of storage of the passage 4, including the liquid droplet ejection head 1 and the conduit 4K, will be described with reference to FIG. 5.

When the liquid droplet ejection operation to manufacture the device ends, the starting of the storage process is commanded. First, the conduit 4K and the tank 3 containing the ink are disconnected from each other. The tank 3C containing the dispersing medium, that is, tetradecane, contained in the ink is connected to the other end 4B of the conduit 4K. When the tank 3C containing tetradecane is connected to the other end 4B of the conduit 4K, the control unit CONT sets a predetermined pressure difference between the one end 4A and the other end 4B of the passage 4 by using the suction unit 9 and the tank pressure adjustment unit 8, as the pressure adjustment unit, and the passage 4 is filled with the tetradecane (Step SB1).

When the passage 4 is filled with the tetradecane, the operations of the tank pressure adjustment unit 8 and the suction unit 9 are interrupted. After that, the conduit 4K and the tank 3C are disconnected from each other, and the other end 4B of the conduit 4K is connected to the tank 3B containing isopropyl alcohol (the first solvent). When the tank 3B containing isopropyl alcohol is connected to the other end 4B of the conduit 4K, the control unit CONT sets a predetermined pressure difference between the one end 4A and the other end 4B of the passage 4 by using the suction unit 9 and the tank pressure adjustment unit 8, as the pressure adjustment unit, and the passage 4 is filled with the first solvent, that is, isopropyl alcohol (Step SB2).

When the passage 4 is filled with the first solvent, the operations of the tank pressure adjustment unit 8 and the suction unit 9 are interrupted. After that, the conduit 4K and the tank 3B are disconnected from each other, and the other end 4B of the conduit 4K is connected to the tank 3A containing the purified water (second solvent). When the tank 3A containing the purified water is connected to the other end 4B of the conduit 4K, the control unit CONT sets a predetermined pressure difference between the one end 4A and the other end 4B of the passage 4 by using the suction unit 9 and the tank pressure adjustment unit 8, as the pressure adjustment unit, and the passage 4 is filled with the purified water (Step SB3).

When the passage 4 is filled with the purified water, the operations of the tank pressure adjustment unit 8 and the suction unit 9 are interrupted. After that, the conduit 4K and the tank 3A are disconnected from each other. The other end 4B of the conduit 4K is connected to the tank containing the water-soluble storage solution, that is, the aqueous polyethylene glycol solution.

When the tank containing the storage solution is connected to the other end 4B of the conduit 4K, the control unit CONT sets a predetermined pressure difference between the one end 4A and the other end 4B of the passage 4 by using the suction unit 9 and the tank pressure adjustment unit 8, as the pressure adjustment unit. The passage 4 is filled with the storage solution (Step SB4). As a result, the passage 4 is filled with the storage solution, and the storage process ends. As described above, in the storage process, the cleaning solutions may be used in the reverse order of those of the cleaning process.

Even in this case, if a predetermined storage solution other than a water-soluble storage solution, such as polyethylene glycol, etc., is used as a storage solution, a solvent dissolving the storage solution may be used as the solvent (second solvent) filling the passage in the step SB3.

Example 1

In each of the plurality of replacement processes, the passage 4 stored by using a storage solution, that is, a 1% aqueous polyethylene glycol solution, is filled and cleaned with the following solvents (cleaning solutions):

First Replacement Process: purified water
Second Replacement Process: isopropyl alcohol
Third Replacement Process: tetradecane After that, the ink (a functional solution) including silver micro-particles dispersed in tetradecane, serving as a dispersing medium is used as a functional solution to form a conductive wiring pattern. Since solid materials are not extracted from the passage 4, it is possible to perform a superior liquid droplet ejection operation.

Example 2

In each of the plurality of replacement processes, the passage 4 stored by using a 1% aqueous polyethylene glycol solution serving as a storage solution is filled and cleaned with the following solvents (cleaning solutions):
First Replacement Process: purified water
Second Replacement Process: ethyl alcohol
Third Replacement Process: diethylene glycol diethyl ether After that, a pattern formation operation is performed by using the ink (a functional solution) including an organic silver compound having diethylene glycol diethyl ether serving as a solvent. Since solid materials are not extracted from the passage 4, it is possible to perform a superior liquid droplet ejection operation.

Now, the pattern formation process to manufacture a device will be described.

Substrate Cleaning Process

First, the substrate is cleaned by using a predetermined solvent, etc. As a result, organic residues, etc., on the substrate are removed. In addition, the organic residues may be removed by illuminating ultraviolet light on the surface of the substrate.

Lyophobization Process

Next, as a portion of the surface treatment process, the surface of the substrate where the wiring pattern is formed is treated to have a lyophobic property over the functional solution. Specifically, the surface treatment of the substrate is performed so that a predetermined contact angle with respect to the functional solution can be above 60 deg, preferably, in a range of 90 to 110 deg. A method of forming a lyophobic film on the surface of the substrate may be used as a method of providing a lyophobic property (wettability).

In the exemplary embodiment, a self-assembled film having the lyophobic property over the surface of the substrate is formed.

In a method of forming the self-assembled film, a self-assembled film made of organic molecular film, etc., is formed on the surface of the substrate, which should form conductive film wiring lines. The organic molecular film used to treat the surface of the substrate includes a functional radical capable of being coupled to the substrate, another function radical at the opposite side thereof, such as a lyophilic radical or a lyophobic radical to modify (controlling a surface energy) a surface property of the substrate, and a straight carbon chain or a branched carbon chain to connect these functional radicals. The organic molecular film is coupled to the substrate and self-assembled to form a molecular film, for example, a monolayer.

Herein, the self assembled film (self-assembled monolayer: SAM) includes a combinative functional radical capable of be coupled with constituent elements of a base layer of the substrate and other straight chained molecules is a film formed by orientating compounds having very high orientation property due to the interaction of the straight chained molecules. Since the self-assembled film is formed by orientating mono-molecules, the film can be made to be very thin and uniform in a molecular level. Since identical molecules are located on the surface of the film, it is possible to provide a uniform, excellent lyophobic or lyophilic property to the surface of the film.

By using, for example, fluoroalkyl silane (hereinafter, referred to as a "FAS") as compounds having the aforementioned high orientation property, the compounds are oriented to locate fluoroalkyl radical on the surface of the film and the self-assembled film is formed, so that a uniform lyophobic property is provided to the surface of the film. Examples of the FAS as compounds constituting this self-assembled film include fluoroalkyl silane such as heptadecafluoro-1,1,2,2 tetrahydro decyltri ethoxy silane, heptadecafluoro-1,1,2,2 tetrahydro decyltri methoxy silane, heptadecafluoro-1,1,2,2 tetrahydro decyltri chloro silane, heptadecafluoro-1,1,2,2 tetrahydro octyltri ethoxy silane, heptadecafluoro-1,1,2,2 tetrahydro octyltri methoxy silane, heptadecafluoro-1,1,2,2 tetrahydro decyltri octyltri silane, and trifluoro propytri methoxy silane. These compounds may be used in a single one or in a combination of two more types. By using the FAS, it is possible to obtain a high degree of contact and excellent lyophobic property.

The general structure formula of the FAS is represented as $Rn-Si-X_{(4-n)}$. Herein, n is an integer in a range of 1 to 3, and X is a hydrolytic radical, such as a methoxy radical, an ethoxy radical, and halogen atoms. In addition, R is a fluoroalkyl radical having a structure of $(CF_3)(CF_2)x(CH_2)y$, where x is an integer in a range of 0 to 10 and y is an integer in a range of 0 to 4. In a case where a plurality of R or X are coupled with Si, all the R or X may or may not identical to each together.

The hydrolytic radicals represented by X form silanol with a hydrolysis to react with hydroxyl radical on the base of the substrate (glass, silicon), thereby being coupled to the substrate with siloxane coupling. Since the R has a fluoric radical, such as $CF_3$ on the surface, the base surface of the substrate can be modified as non-wettable (low surface energy) surface.

Figure 6:
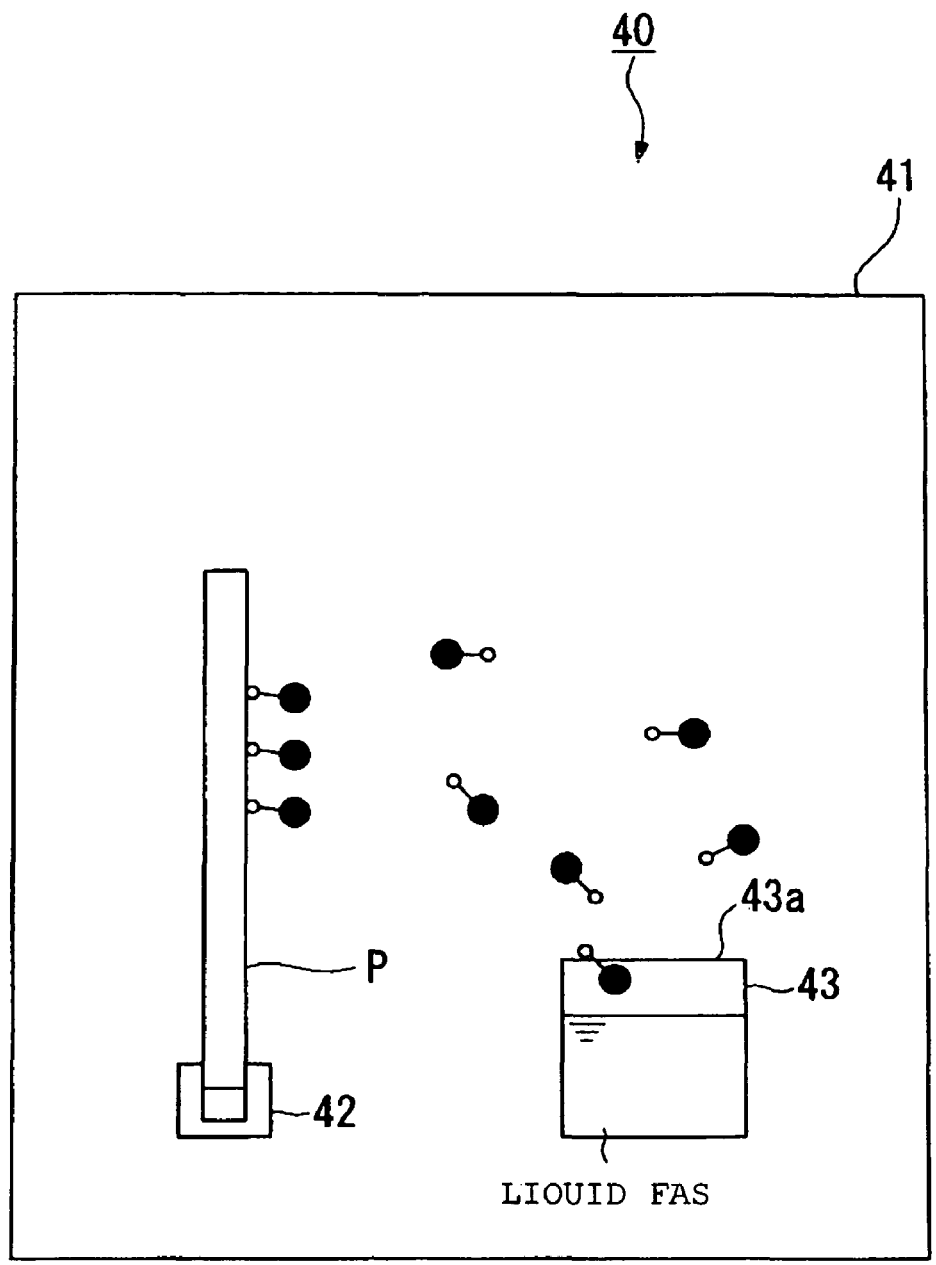
FIG. 6 is a schematic illustrating an example of a pattern formation sequence according to an aspect of the present invention.

FIG. 6 is a schematic of a FAS treatment apparatus 40 to form the self-assembled film (FAS film) made of FAS on the substrate P. The FAS treatment apparatus 40 forms the self-assembled film made of FAS on the substrate P and provides a lyophobic property. As shown in FIG. 6, the FAS treatment apparatus 40 includes a chamber 41, a substrate holder 42 provided in the chamber 41 to hold the substrate P, and a container 43 to accommodate liquid-phase FAS (liquid FAS). In addition, if the substrate P and the container 43 accommodating the liquid FAS are left in the chamber 41 under an environment of the room temperature, the liquid FAS in the container 43 emits in a vapor phase to the chamber 41 from an opening 43a of the container 43. The self-assembled film made of FAS are formed on the substrate P for example in two or three days. By maintaining the overall chamber 1 at the temperature of about 100° C., the self-assembled film is formed on the substrate P for about three hours.

Although the method of forming the self-assembled film from the vapor phase is described, the self-assembled film can be formed from a liquid phase. For example, the substrate is immersed into a solution containing raw compounds, and then, the self-assembled film is formed on the substrate by performing cleaning and drying processes.

The lyophobic film may be a fluoride polymer film formed by a plasma treatment process. In the plasma treatment process, plasma is irradiated on the substrate in a normal pressure or in vacuum. Various types of gases used in the plasma treatment process can be selected in consideration of a material of the surface of the substrate P where the wiring pattern is to be formed. Examples of the process gasses include, for example, tetrafluoro methane, perfluoro hexane, and perfluoro decane.

The process to provide a lyophobic property to the surface of the substrate P may be performed by adhering a polyimide film, manufactured from a film having a desired lyophobic property, for example, tetrafluoro ethylene, to the surface of the substrate. A polyimide film having a highly lyophobic property may be as the substrate.

Lyophilization Treatment Process

After the FAS treatment is performed on the substrate P, as a portion of the surface treatment process, the lyophilization treatment is performed to provide a lyophilic property on the pattern formation region on the surface of the substrate where the wiring pattern is formed. Examples of the process to provide the lyophilic property include a process to illuminate ultraviolet light having a wavelength of about 170 to 400 nm. By illuminating the ultraviolet light (UV) having a predetermined power on the pattern formation region of the substrate P for a predetermined time period, the lyophobic property of the pattern formation region of the FAS-treated substrate is reduced, so that the pattern formation region can have a desired lyophilic property.

Figure 7:
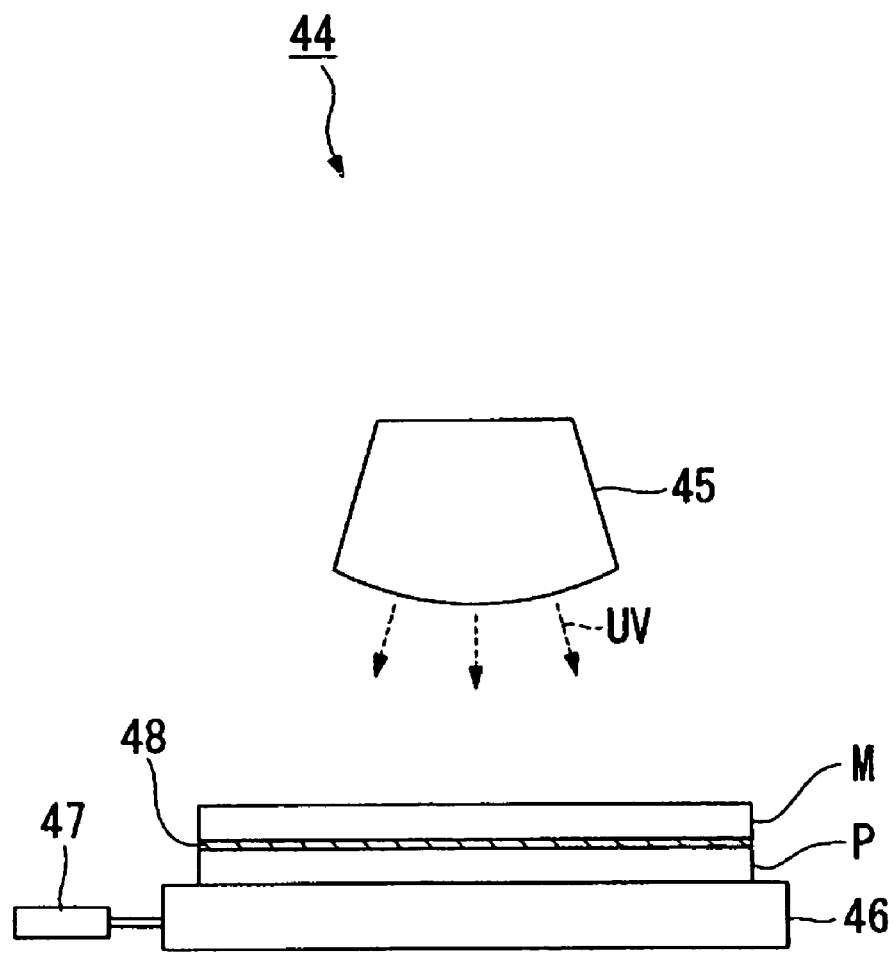
FIG. 7 is a schematic illustrating an example of a pattern formation sequence according to an aspect of the present invention.

FIG. 7 is a schematic illustrating an UV illumination apparatus 44 to illuminate ultraviolet light on the FAS-treated substrate P. As shown in FIG. 7, UV illumination apparatus 44 includes a UV emitting unit 45 to emit the UV light having a predetermined wavelength, a stage 46 to support the substrate P, and a stage driving unit 47 to scan the stage 46 to support the substrate P in a predetermined direction. The UV illumination apparatus 44 illuminates the UV light on the substrate P by emitting the UV light on the substrate with the UV emitting unit 45 while scanning the substrate P in the predetermined direction. In a case where the substrate P is small, the UV light may be illuminated without the substrate P being scanned. The ultraviolet light may be irradiated on the substrate P while moving the UV emitting unit 45. By illuminating the UV light, the FAS film on the substrate P is destroyed, so that the UV-illuminated region on the substrate P can be lyophilized (that is, the lyophobic property being lowered).

Herein, UV illumination apparatus 44 illuminates the UV light on the substrate P though a mask M having a pattern in accordance with the pattern formation region on the substrate. The UV illumination apparatus 44 selectively destroys the FAS film by illuminating the UV light on the substrate P though the mask M, so that the pattern formation region on the substrata P can be lyophilized. As a result, a FAS film surrounding the pattern formation region is formed.

In the present exemplary embodiment, a titanium oxide film 48 is provided on a lower surface of the mask M, and the UV light is illuminated in a state where the titanium oxide film 48 and the surface of the substrate P is contacted to each other.

By illuminating the UV light under the state that the titanium oxide is contacted to the FAS film, it is possible to perform the lyophilization (that is, destruction of the FAS film) in a short time due to the optical-catalytic effect of titanium oxide. The lyophilization of the pattern formation region of the substrate can be obtained without the titanium oxide film 48 being provided at the lower surface of the mask M. The lyophilization of the pattern formation region of the substrate can be obtained by illuminating the UV light in a state that the mask M and the substrate P are separated from each other.

The operation of the UV illumination apparatus 44 is controlled by a control unit (not shown). The control unit sets conditions of the UV illumination operation and the illumination operation of the UV illumination apparatus 44 is controlled based on the set conditions. Herein, the settable conditions of the UV illumination include at least one of UV illumination time with respect to the substrate P, an illumination amount (light amount) on a unit area of the substrate P, and wavelength of the illuminated UV light. The control unit controls the illumination operation based on at least one of these conditions. As a result, the pattern formation region of the substrate P can have a desired lyophilic property (contact angle with respect to the functional solution).

Although the UV illumination treatment is used as the lyophilization treatment, the lyophobic property of the substrate may be reduced by exposing the substrate to an ozone atmosphere.

Material Disposing Process

Now, a material disposing process of the present exemplary embodiment will be described. The material disposing process is a process to form a film pattern (a wiring pattern) having a shape of a line on the substrate P by ejecting the liquid droplets 30 of the functional solution containing a wiring pattern formation material from the liquid droplet ejection head 1 of the liquid droplet ejection apparatus IJ to dispose the liquid droplets in the pattern formation region. In the exemplary embodiment, the functional solution includes silver particles compound dispersed in tetradecane, serving as a dispersing medium.

Herein, since the lyophobic FAS film region (lyophobic film region) surrounding the pattern formation region is formed, it is possible to reduce or prevent liquid droplets disposed on the pattern formation region from spreading over a predetermined location. Even though some of ejected liquid droplets are disposed on the lyophobic region, they are repulsed from the lyophobic region due to the lyophobic property, so that they can be disposed on the pattern formation region. Since the lyophilic property is provided to the pattern formation region of the substrate P, the ejected liquid droplets can further easily spread on the pattern formation region, so that the functional solution can be uniformly disposed at a predetermined location.

Figure 8A:
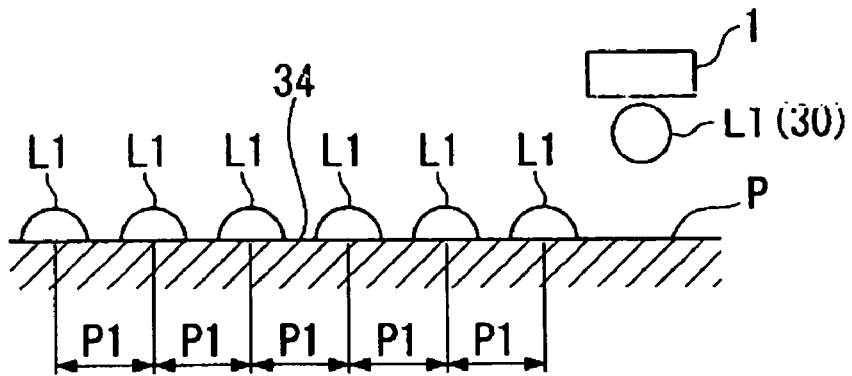
FIGS. 8a-8c are schematics illustrating an example of a pattern formation sequence according to an aspect of the present invention.
Figure 8B:
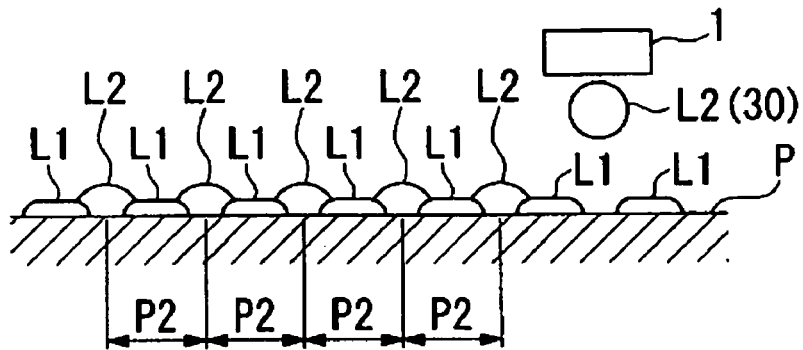
Figure 8C:
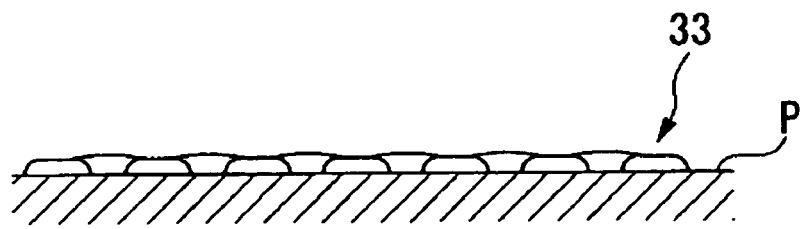

FIGS. 8a-8c are schematics illustrating an example of a sequence to dispose the liquid droplets when the wiring pattern is formed.

As shown in FIG. 8a, liquid droplets L1 (30) ejected from the liquid droplet ejection head 1 are sequentially disposed on the pattern formation region 34 of the substrate P in a predetermined interval.

That is, the liquid droplet ejection head 1 disposes the liquid droplets L1 not to overlap each other on the substrate P. In the example, a disposing pitch P1 of the liquid droplets L1 is set to be larger than a diameter of each of the liquid droplets L1 just after disposed on the substrate P. As a result, the liquid droplets L1 just after disposed on the substrate P do not overlap each other (that is, they do not contact each other), it is possible to reduce or prevent the liquid droplets L1 from being integrated and spreading while wetting the substrate P.

The disposing pitch P1 of the liquid droplets L1 is set to be smaller than twice the diameter of each of the liquid droplets L1 just after disposed on the substrate P. Here, after the liquid droplets L1 are disposed on the substrate P, the intermediate drying process (Step S5) may be performed in order to remove a solvent if necessary.

Next, as shown in FIG. 8b, the aforementioned operation of disposing the liquid droplets is repeated.

That is, similar to the previous operation shown in FIG. 8a, liquid droplets L2 of the functional solution are ejected from the liquid droplet ejection head 1. The liquid droplets L2 are disposed on the pattern formation region 34 of the substrate P in a certain interval. At this time, volume (amount of the functional solution per unit liquid droplet) of each of the liquid droplets L2 and the disposing pitch P2 are the same as those of the previous liquid droplets L1. The disposing location of each of the liquid droplets L2 are shifted by ½ pitch from the location of the each of the liquid droplets L1. The liquid droplets L2 are disposed between the previous liquid droplets L1 disposed on the substrate P. As described above, the disposing pitch P1 of the liquid droplets L1 on the substrate P is larger than the diameter of each of the liquid droplets L1 just after being disposed on the substrate P and smaller than twice the diameter. For this reason, by disposing the liquid droplets L2 on the intermediate position between the liquid droplets L1, some of the liquid droplets L2 overlap the liquid droplets L1, so that a gap between the liquid droplets L1 can be filled. At this time, although the current liquid droplets L2 is adjacent to the previous liquid droplets L1, since some or all of the solvent in the previous liquid droplets L1 have been already removed, there are few cases that their integration and spreading on the substrate P occur. After the liquid droplets L2 are disposed on the substrate P, the intermediate drying process may be performed similar to the previous operation in order to remove the solvent.

By repeating the series of the disposing operations of the liquid droplets, the gaps between the liquid droplets of the substrate P are filled, and as shown in FIG. 8c, a continuous linear wiring pattern 33 is formed on the substrate P. In this case, by increasing the number of repetitions of the disposing operation of the liquid droplets, the liquid droplets sequentially overlap each other on the substrate P, so that the film thickness of the wiring pattern 33 can increase.

The conditions of the liquid droplet ejection may be selected as follows. The weight of the ink is 4 ng/dot. The ink flow rate (the ejection speed) is in a range of 5 to 7 msec. With respect to the ejection ambiance of the liquid droplets, the temperature and the humidity may be set to 60° C. or less and 80% or less, respectively. As a result, it is possible to perform a stable liquid droplet ejection without clogging of the ejection nozzle of the liquid droplet ejection head 1.

Intermediate Drying Process

After the liquid droplets are ejected on the substrate P, a drying process is performed in order to remove the (solvent) dispersing media and ensure thickness of the film, if necessary. The drying process may employ, for example, a lamp annealing process as well as a general process using hot plates, electric furnaces, or the like, to heat the substrate P. A light source used for the lamp annealing process includes, but not limited to, an infrared lamp, a xenon lamp, a YAG laser, an argon laser, a carbon dioxide laser, an excimer laser using XeF, XeCl, XeBr, KrF, KrCl, ArF, ArCl, etc.

Although the powers of these lasers are generally in a range of 10 to 5000 W, the laser of the present exemplary embodiment satisfactorily utilizes the power of 100 to 1000 W. In addition, a plurality of liquid droplets of the functional solution are stacked to form a plurality of films by repetition of the intermediate drying process and the material disposing process, so that the wiring pattern (the film pattern) having a large thickness can be formed.

Firing Process

The conductive material, for example, the organic silver compound, after the ejection process needs to be subjected to a thermal treatment to remove an organic component of the organic silver compound and retain the silver particles in order to obtain its conductivity.

For this reason, a thermal treatment and/or an optical treatment are performed on the substrate after the ejection process. Although the thermal treatment and/or the optical treatment are generally performed at the atmosphere, it may be performed at an inert gas ambiance using nitrogen, argon, helium, etc., if necessary. The process temperature of the thermal treatment and/or the optical treatment is suitably selected in consideration of a boiling point (a vapor pressure) of a dispersing medium, types or pressure of ambient gas, a dispersibility of micro-particles, an organic silver compound, thermal behaviors, such as an oxidation property, presence or absence of a coating material, and an amount of the coating material, heat-resistant temperature of a base material, etc. For example, a firing process is necessarily performed at about 200° C. to remove organic materials of the organic silver compound. In case of the substrate being made of plastic, the firing process may be performed at a temperature of the room temperature to 100° C. According to the foregoing process, the conductive materials (the organic silver compound) after the ejection process are transformed into a conductive film (the wiring pattern) 33 due to the retaining of the silver particles, as shown in FIG. 8c.

In the aforementioned exemplary embodiments, the substrate used for the conductive film wiring may utilize glass, quartz glass, Si wafer, a plastic film, a metal plate, or others various materials. It includes these various material substrates on which a semiconductor film, a metal film, a dielectric film, an organic films, etc. are formed as a base layer.

Although the functional solution used for the conductive film wiring utilizes a conductive material including the organic silver compound dissolved in a solvent in the aforementioned exemplary embodiment, it is possible to utilize the dispersing solution in which the conductive micro-particles are dispersed, and it may be a water-based or oil-based material. The conductive micro-particles may be a conductive polymer or a superconductive micro-particle as well as metal containing any one of gold, silver, copper, palladium, and nickel. These conductive micro-particles in which surfaces are coated with organic materials may be used in order to enhance dispersibility.

The diameter of the conductive micro-particle may be in a range of 5 nm to 0.1 μm.

If the diameter is lager than 0.1 μm, the nozzle of the liquid droplet ejection head may be disadvantageously clogged. However, if the diameter is smaller than 5 nm, the volume ratio of the coating with respect to the conductive micro-particle increases, so that the ratio of the organic materials with respect to the obtained film is too excessive.

The vapor pressure of the dispersing medium of a liquid containing the conductive micro-particles at the room temperature may be in a range of 0.001 to 200 mmHg (about 0.133 to about 26600 Pa). If the vapor pressure is higher than 200 mmHg, the dispersing medium after being ejected is too rapidly vaporized, and it is difficult to form a superior film.

The vapor pressure of the dispersing medium may be in a range of 0.001 mmHg to 50 mmHg (about 0.133 to 6650 Pa). If the vapor pressure is higher than 50 mmHg, in case of the liquid droplets being ejected with an inkjet method, the nozzle clogging due to drying may easily occur. In a case where the vapor pressure of the dispersing medium at the room temperature is lower than the 0.001 mmHg, the drying rate is too slow and thus the dispersing medium may disadvantageously remain, so that it is difficult to obtain a superior conductive film after the thermal and optical treatments in the following processes.

The dispersing medium capable of dispersing the aforementioned conductive micro-particles may be, not particularly limited to, but a material that does not generate agglutination. Although the dispersing medium in the present exemplary embodiment utilizes tetradecane, the dispersing medium includes, for example, water, an alcohol, such as methanol, ethanol, propanol, butanol, etc., a hydrocarbon compound such as n-heptane, n-octane, decane, toluene, xylene, cymene, durene, indene, dipentene, tetrahydro naphthalene, decahydro naphthalene, cyclo hexylene, etc., an ether compound, such as ethylene glycol dimethly ether, ethylene glycol diethly ether, ethylene glycol methyl ethyl ether, diethylene glycol dimethly ether, diethylene glycol methyl ethyl ether, 1,2-dimethoxy ethane, bis(2-methoxy ethyl) ether, p-dioxane, etc., and a polar compound, such as propylene carbonate, γ-butyrolactone, N-methyl-2-pyrolidone, dimethyl formamide, dimethyl sulphaoxide, cyclo hexanone, etc. Among them, in terms of dispersibiltiy of the micro-particles, stability of the dispersing solution, easy applicability to the liquid droplet ejection method, the water, the alcohol compound, the hydrocarbonate compound, and the ether compound are preferable. Preferred dispersing media are the water and the hydrocarbonate compound. These dispersing media may be used individually or in a combination of two kinds or more.

In case of the conductive micro-particles being dispersed in a dispersing medium, the concentration of the dispersoid is in a range of 1 to 80 percent by weight, and it may be advantageously adjusted in accordance with the thickness of a desired conductive film. If the concentration is above 80 percent by weight, it is difficult to generate cohesion, and it is difficult to obtain a uniform film.

The surface tension of the dispersing solution of the conductive micro-particles may be in a range of 0.02 N/m to 0.07 N/m. When a liquid material is ejected with the liquid droplet ejection method, if the surface tension is less than 0.02 N/m, since the wettability of the liquid material with respect to the nozzle plane increases, the flight deviation can disadvantageously occur. If the surface tension is more than 0.07 N/m, since the meniscus shape at the front end of the nozzle is not stabilized, it is difficult to control ejection amount and ejection timing.

In order to adjust the surface tension, an infinitesimal amount of a surface tension control agents, such as fluorine, silicon, and nonion control agents are added to the dispersing solution to an extent that the control agents cannot deteriorate the contact angle with respect to the substrate. The nonion surface tension control agents enhance wettability of the liquid with respect to the substrate to enhance the leveling of the film and to reduce or prevent the fine unevenness of the film from being generated. The dispersing solution may include an organic compound, such as alcohol, ether, ester, ketone, etc., if necessary.

The viscosity of the dispersing solution may be in a range of 1 to 50 mPa·s. In case of the liquid droplets as the liquid material being ejected with the liquid droplet ejection method, if the viscosity is smaller than 1 mPa·S, the peripheral portion of the nozzle can be easily contaminated due to effusion of the liquid material. In addition, if the viscosity is larger than 50 mPa·S, the frequency of the clogging of the nozzle opening increases so that it is difficult to smoothly eject the liquid droplets.

Electro-Optical Device>

Figure 9:
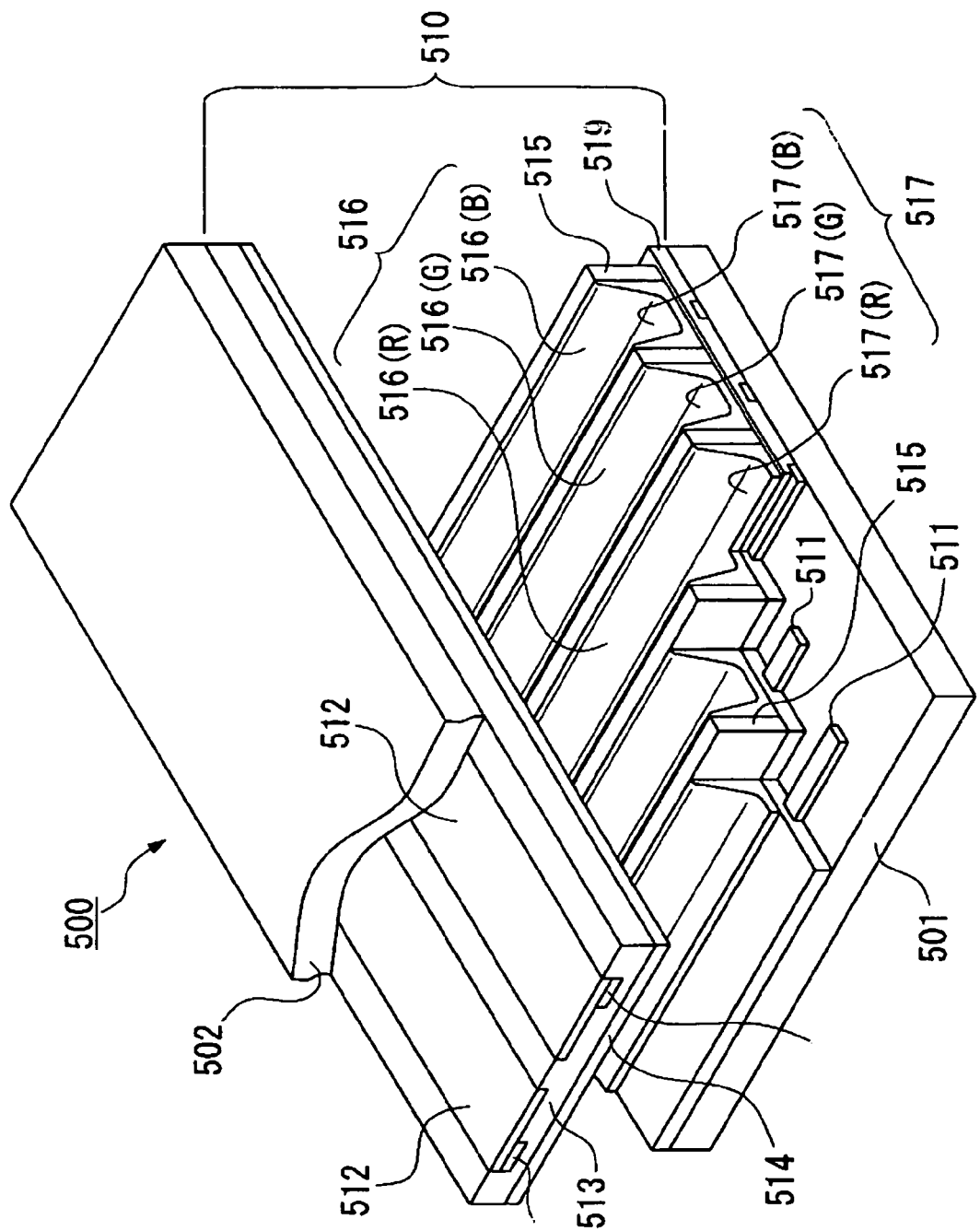
FIG. 9 is a schematic illustrating an electro-optical device according to an aspect of the present invention.

Now, a plasma display apparatus as an example of an electro-optical device according to an aspect of the present invention will be described. FIG. 9 is schematic illustrating the plasma display apparatus 500 of the present exemplary embodiment.

The plasma display apparatus 500 includes substrates 501 and 502 facing each other and a discharge display plate 510 interposed therebetween. The discharge display plate 510 includes a plurality of discharge cells 516. Three discharge cells 516 of red, green, and blue discharge cells 516(R), 516(G), and 516(B) among the plurality of discharge cells 516 constitute a single pixel.

Address electrodes 511 are provided in stripes in a predetermined interval on an upper surface of the substrate 501, and a dielectric layer 519 is provided to cover the address electrodes 511 and the upper surface of the substrate 501. On the dielectric layer 519, partition walls 515 are disposed between the address electrodes 511 and 511 to extend along with the respective address electrodes 511. The partition walls 515 include partition walls adjacent to left and right sides of the address electrodes 511 in the width direction thereof and partition walls extending in a direction perpendicular to the address electrodes 511.

The discharge cells 516 are provided to correspond to rectangular spaces partitioned by the partition walls 515. In addition, the fluorescent layers 517 are provided inside the rectangular spaces partitioned by the partition walls 515. Each of the fluorescent layers 517 emits a fluorescent ray having one of red, green, and blue colors. Red, green, and blue fluorescent materials 517(R), 517(G), and 517(B) are provided to the respective bottoms of the red, green, and blue discharge cells 516(R), 516(G), and 516(B).

A plurality of display electrodes 512 are provided on the substrate 502 in stripes in a predetermined interval in a direction perpendicular to the aforementioned address electrodes 511. A dielectric layer 513 and a protective film 514 made of MgO, etc., are provided to cover these electrodes 512. The substrates 501 and 502 are coupled to each other so that the address electrodes 511 • • • and the display electrodes 512 • • • are perpendicular to each other. The address electrodes 511 and the display electrodes 512 are connected to an AC voltage source (not shown). The electrical turn on, of each of the electrodes, allows the fluorescent materials 517 in the display discharge portion 510 to excite and emit rays of light, so that color display can be implemented.

In the exemplary embodiment, the address electrodes 511 and the display electrodes 512 are formed based on the pattern formation method of an aspect of the present invention.

Now, a liquid crystal apparatus as another example of the electro-optical device of an aspect of the present invention will be described.

Figure 10:
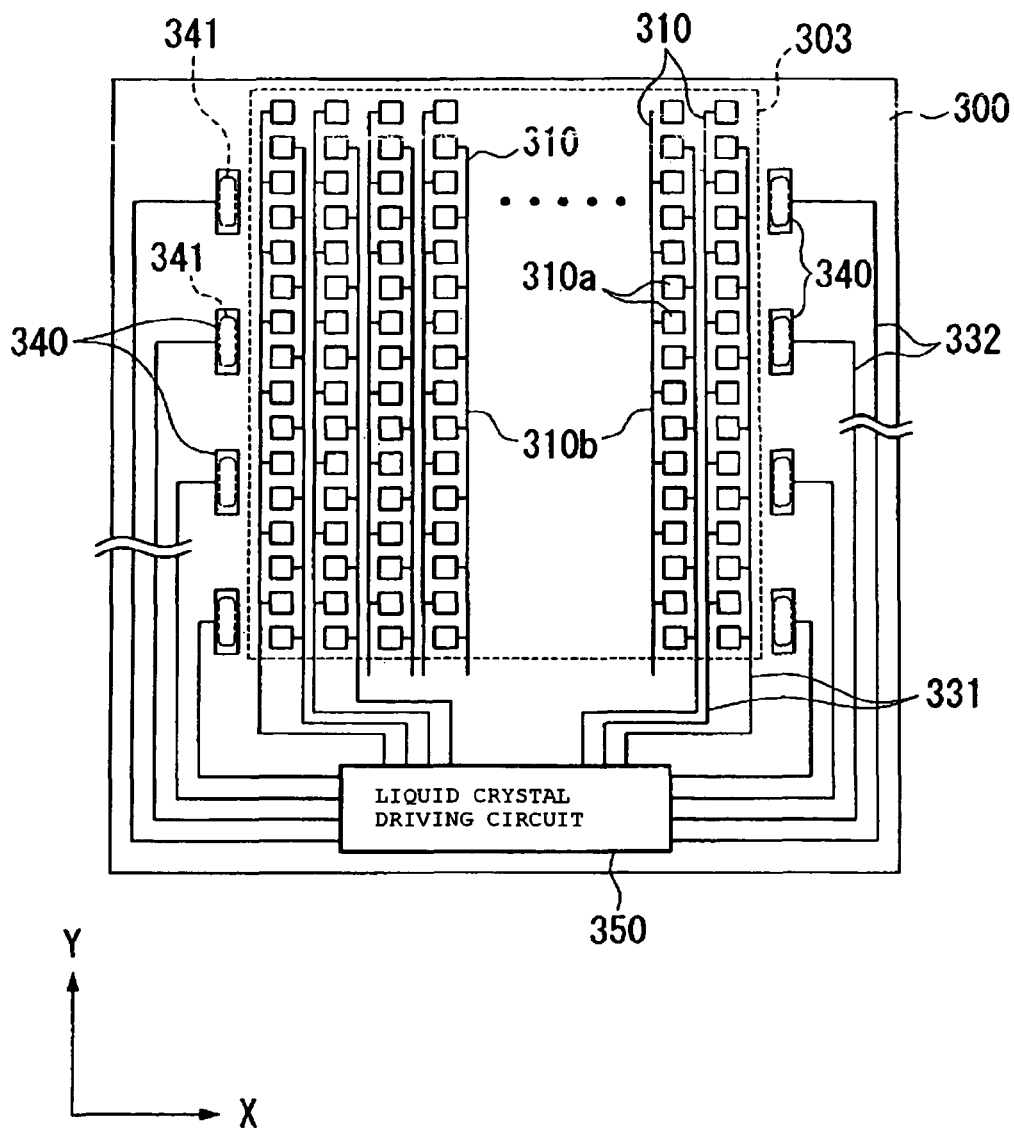
FIG. 10 is a schematic illustrating an example of an electro-optical device according to an aspect of the present invention.

FIG. 10 is a schematic illustrating a planar layout of signal electrodes and the like on a first substrate of the liquid crystal apparatus according to an aspect of the present invention. The liquid crystal apparatus according to an aspect of the present invention are schematically constructed with the first substrate, a second substrate (not shown) on which scanning electrodes and the like are provided, and liquid crystals (not shown) interposed between the first and second substrate.

As shown in FIG. 10, a plurality of signal electrodes 310 are provided in a multiple-matrix shape on a pixel region 303 on the first substrate 300. In particular, each of the signal electrodes 310 • • •, constructed with a plurality of pixel electrodes portions 310a • • • that is provided to correspond to each of the pixels and a plurality of signal wiring portions 310b • • • that connect the pixel electrode portions in a matrix, extends in Y direction. Reference numeral 350 indicates a liquid crystal driving circuit having a single chip structure. The liquid crystal driving circuit 350 is connected to the one ends (lower side of the drawing) of the signal wiring portions 310b • • • through first surrounding wirings 331 • • •. Reference numeral 340 indicates up-down interconnection terminals. The up-down interconnection terminals 340 • • • are connected to terminals (not shown) provided on the second substrate through up-down interconnection materials 341 • • •.

The up-down interconnection terminals 340 • • • are connected to the liquid crystal driving circuit 350 through second surrounding wirings 332 • • •.

In the exemplary embodiment, the signal wiring portions 310b •••, the first surrounding wirings 331 •••, and the second surrounding wirings 332 •••, which are provided on the first substrate 300, are formed based on the pattern formation method of an aspect of the present invention. Since the method can be adapted to manufacture a large liquid crystal substrate, the wiring materials can be efficiently used so that cost can be reduced. The devices to which the present invention can be adapted is not limited to these electro-optical devices, but can be adapted to, for example, manufacturing a circuit board where conductive film wiring is formed, semiconductor mounting wiring, and other devices.

Electronic Apparatus

Figure 11:
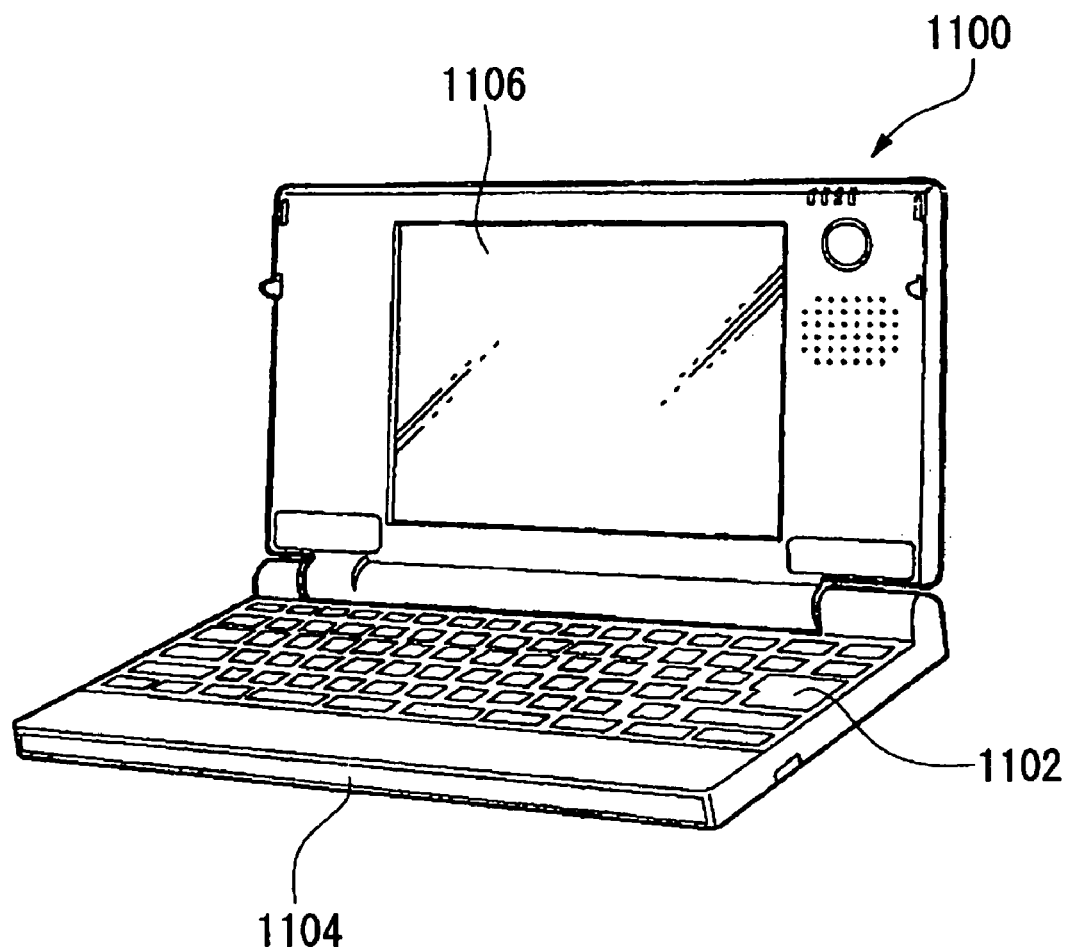
FIG. 11 is schematic illustrating a specific example of an electronic apparatus according to an aspect of the present invention.

Now, examples of the electronic apparatus of an aspect of the present invention will be described. FIG. 11 is a schematic illustrating construction of a mobile-type personal computer (information processing device) including a display device according to the aforementioned exemplary embodiments. In the drawing, the personal computer 1100 includes a main body 1104 having a keyboard 1102 and a display device unit having the aforementioned electro-optical device 1106.

For this reason, it is possible to provide an electronic apparatus including a display portion having high luminescence efficiency and brightness.

In addition to the aforementioned examples, other examples include, for example, a cellular phone, a wristwatch type electronic apparatus, liquid crystal television set, a view finder or monitor direct view type video tape recorder, a car navigation apparatus, a pager, an electronic note, a calculator, a word processor, a work station, a television phone, a POS terminal, an electronic paper, an apparatus having a touch panel and the like. The electro-optical device of an aspect of the present invention may be adapted to display unit of these electronic apparatus. In addition, the electronic apparatus of the present exemplary embodiment may include other various electro-optical devices such as a liquid crystal device, an organic electro-luminescent display device, and a plasma type display device.

Although the foregoing description has been made on the suitable exemplary embodiments according to an aspect of the present invention with reference to the accompanying drawings, the present invention is not limited to the above exemplary embodiments. Various shapes of components or their combinations in the above described examples are simply exemplary ones. Therefore, various modifications may be made thereto based on design requirements without departing from the invention.

What is claimed is:

1. A method of cleaning a liquid droplet ejection apparatus having a passage including a liquid droplet ejection head and a conduit to feed an ink solution to the liquid droplet ejection head, the method comprising:

filling the passage with water;

replacing the water with a first solvent capable of dissolving both the water and a second solvent contained in the ink solution, and suctioning the water from the liquid droplet ejection head by a suction unit, the suction unit including a pump, the water being removed from the passage; and replacing the first solvent with the second solvent contained in the ink solution, and suctioning the first solvent from the liquid droplet ejection head by the pump of the suction unit, the first solvent being removed from the passage.

2. The method according to claim 1, further comprising: replacing the second solvent with the ink solution, and suctioning the second solvent from the liquid droplet ejection head by the pump of the suction unit, the second solvent being removed from the passage.

3. A method of storing a passage including a liquid droplet ejection head and a conduit to feed an ink solution to the liquid droplet ejection head, the method comprising:

filling the passage with a first solvent contained in the ink solution;

replacing the first solvent with a second solvent capable of dissolving both the first solvent and water, and suctioning the first solvent from the liquid droplet ejection head by a suction unit, the suction unit including a pump, the first solvent being removed from the passage;

replacing the second solvent with water, and suctioning the second solvent from the liquid droplet ejection head by the pump of the suction unit, the second solvent being removed from the passage; and replacing the water with a water-soluble storage solution, and suctioning the water from the liquid droplet ejection head by the pump of the suction unit, the water being removed from the passage.

4. A storage method including filling a passage, including a liquid droplet ejection head and a conduit to feed an ink solution to the liquid droplet ejection head, with a predetermined storage solution, the method comprising:

filling the passage with a first solvent contained in the ink solution;

replacing the first solvent with a second solvent capable of dissolving both the first solvent and the predetermined storage solution, and suctioning the first solvent from the liquid droplet ejection head by a suction unit, the suction unit including a pump, the first solvent being removed from the passage;

replacing the second solvent with a third nonpolar solvent capable of dissolving the predetermined storage solution, and suctioning the second solvent from the liquid droplet ejection head by the pump of the suction unit, the second solvent being removed from the passage; and replacing the third nonpolar solvent with the predetermined storage solution, suctioning the third nonpolar solvent from the liquid droplet ejection head by the pump of the suction unit, the third nonpolar solvent being removed from the passage.

5. A method of cleaning a passage including a liquid droplet ejection head filled with a predetermined storage solution and a conduit to feed an ink solution to the liquid droplet ejection head, the method comprising:

replacing the predetermined storage solution with a first solvent capable of dissolving the predetermined storage solution, and suctioning the predetermined storage solution from the liquid droplet ejection head by a suction unit, the suction unit including a pump, the predetermined storage solution being removed from the passage;

replacing the first solvent with a second solvent capable of dissolving both the first solvent and a third nonpolar solvent contained in the ink solution, and suctioning the first solvent from the liquid droplet ejection head by the pump of the suction unit, the first solvent being removed from the passage;

replacing the second solvent with the third nonpolar solvent contained in the ink solution, and suctioning the second solvent from the liquid droplet ejection head by the pump of the suction unit, the second solvent being removed from the passage; and replacing the third nonpolar solvent with the ink solution, suctioning at least one of the third nonpolar solvent and the ink solution from the liquid droplet ejection head by the pump of the suction unit, at least one of the third nonpolar solvent and the ink solution being removed from the passage.

6. The method according to claim 5, the ink solution including an organic EL ink material.

7. The method according to claim 5, the ink solution including an organic RGB ink material.

8. The method according to claim 5, the ink solution including an organic silver compound.

9. The method according to claim 5, the ink solution including conductive particles.

* * * * *